United States Patent
Zandy et al.

(10) Patent No.: US 6,460,104 B1
(45) Date of Patent: *Oct. 1, 2002

(54) SCSI CONNECTOR

(75) Inventors: Michael S. Zandy, Spring; George J. Scholhamer, The Woodlands; William C. Galloway, Houston, all of TX (US)

(73) Assignee: Compaq Information Technologies Group, L.P., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/676,958

(22) Filed: Oct. 2, 2000

Related U.S. Application Data

(63) Continuation of application No. 08/867,102, filed on Jun. 2, 1997, now Pat. No. 6,126,451.

(51) Int. Cl.⁷ .............................................. G06F 13/14
(52) U.S. Cl. .................... 710/129; 439/61; 439/65; 439/631; 361/777; 361/778
(58) Field of Search .................... 710/129; 439/61, 439/65, 631; 361/777, 788

(56) References Cited

U.S. PATENT DOCUMENTS

| | | | | |
|---|---|---|---|---|
| 5,175,822 A | * | 12/1992 | Dixon et al. | 395/275 |
| 5,237,660 A | * | 8/1993 | Weber et al. | 395/250 |
| 5,289,340 A | * | 2/1994 | Youshifuji et al. | 439/61 |
| 5,903,442 A | * | 5/1999 | Kanai et al. | 439/61 |
| 5,930,119 A | * | 7/1999 | Berding | 439/61 |

\* cited by examiner

*Primary Examiner*—Jeffrey Gaffin
*Assistant Examiner*—Abdelmoniem Elamin

(57) ABSTRACT

In a computer system having redundant SCSI controllers cards, a SCSI controller interface for receiving multiple interchangeable SCSI controller cards is configured so that the data bus paths between each of the SCSI controller slots and the controller circuitry do not cross.

11 Claims, 4 Drawing Sheets

SCSI CONNECTOR

This application is a Continuation of application Ser. No. 08/867,102 filed Jun. 2, 1997.

FIELD OF THE INVENTION

The present invention relates to computer connectors, and more particularly, but not by way of limitation, to a small computer systems interface (SCSI) connector interface for receiving multiple, redundant and interchangeable SCSI controllers.

BACKGROUND OF THE INVENTION

Today's businesses are becoming more and more dependent upon computer systems, including network computer systems, for their day-to-day operations. As can be appreciated, the requirement for minimum down-time of these computer systems is imperative, especially in network computer systems, where many users can be affected when a single component in the systems fails.

Some of the current computer technologies have started utilizing "hot pluggable", redundant power supplies, whereby if one supply fails or needs replacing, the power to the computer system is maintained by the second power supply, such that the computer system does not need to be powered down while the defective power supply is being repaired or replaced. However, as can be appreciated, there are many other components such as controller interface, within a computer system that can fail, causing system downtime.

Many current computer systems use a small computer systems interface (SCSI) for connecting peripheral components, such as scanners, hard disk drives and compact disk drives, to the computer system via a standard hardware interface, which uses standard SCSI commands. If the SCSI controller fails, access by the users to the device drives controlled by the SCSI is prevented.

Therefore, it is highly desirable to have a hot pluggable, SCSI backplane interface that can receive redundant, interchangeable SCSI controller cards.

SUMMARY OF THE INVENTION

The present invention overcomes the above identified problems as well as other shortcomings and deficiencies of existing technologies by providing a computer system utilizing a SCSI controller backplane configured for receiving multiple interchangeable SCSI controller cards. The SCSI controller backplane is further configured so that the data paths between the SCSI controller slots and the SCSI controller circuitry do not cross.

BRIEF DESCRIPTION OF THE DRAWINGS

A more complete understanding of the present invention may be had by reference to the following Detailed Description and appended claims when taken in conjunction with the accompanying Drawings wherein:

DETAILED DESCRIPTION

Figure 1:
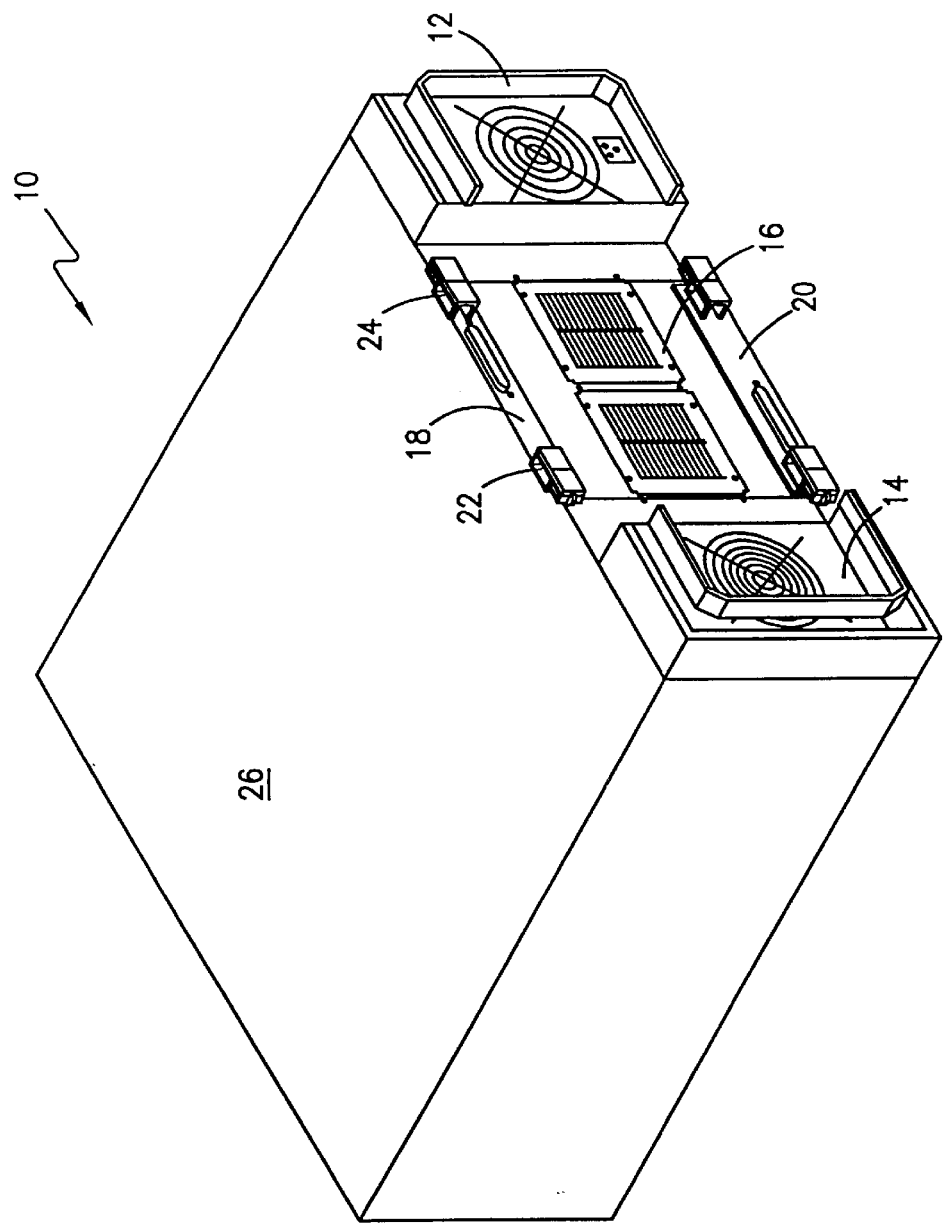
FIG. 1 is a rear perspective view of a computer system utilizing the present invention.

Referring now to the drawings wherein like or similar elements are designated with identical reference numerals throughout the several views, and wherein the various elements depicted are not necessarily drawn to scales, and, in particular, to FIG. 1, there is shown a rear perspective view of a computer system 10 utilizing the present invention. As depicted, computer system 10 includes redundant power supplies 12 and 14, cooling system 16 and redundant small computer systems interface (SCSI) controller cards 18 and 20. Each of SCSI controller cards 18 and 20 include installation clips 22 and 24 for securing the SCSI controller cards 18 and 20 within the computer system 10. As can be appreciated, the redundancy of SCSI controller cards 18 and 20 provides for a back-up system wherein if one SCSI controller card fails the other can take over until proper maintenance can take place, and, further, the redundancy enables the SCSI controller cards to be hot pluggable, i.e. the redundancy enables the SCSI controller cards to be removed and installed without powering down the computer system. This helps to reduce down-time of computer system 10 for repair or replacement of SCSI controllers cards 18 and 20.

Still referring to FIG. 1, it is also preferred that SCSI controller cards 18 and 20 be interchangeable with each other, with each being inserted into computer system 10 in a "flipped" horizontal relationship, i.e. a 180° opposite orientation.

Figure 2:
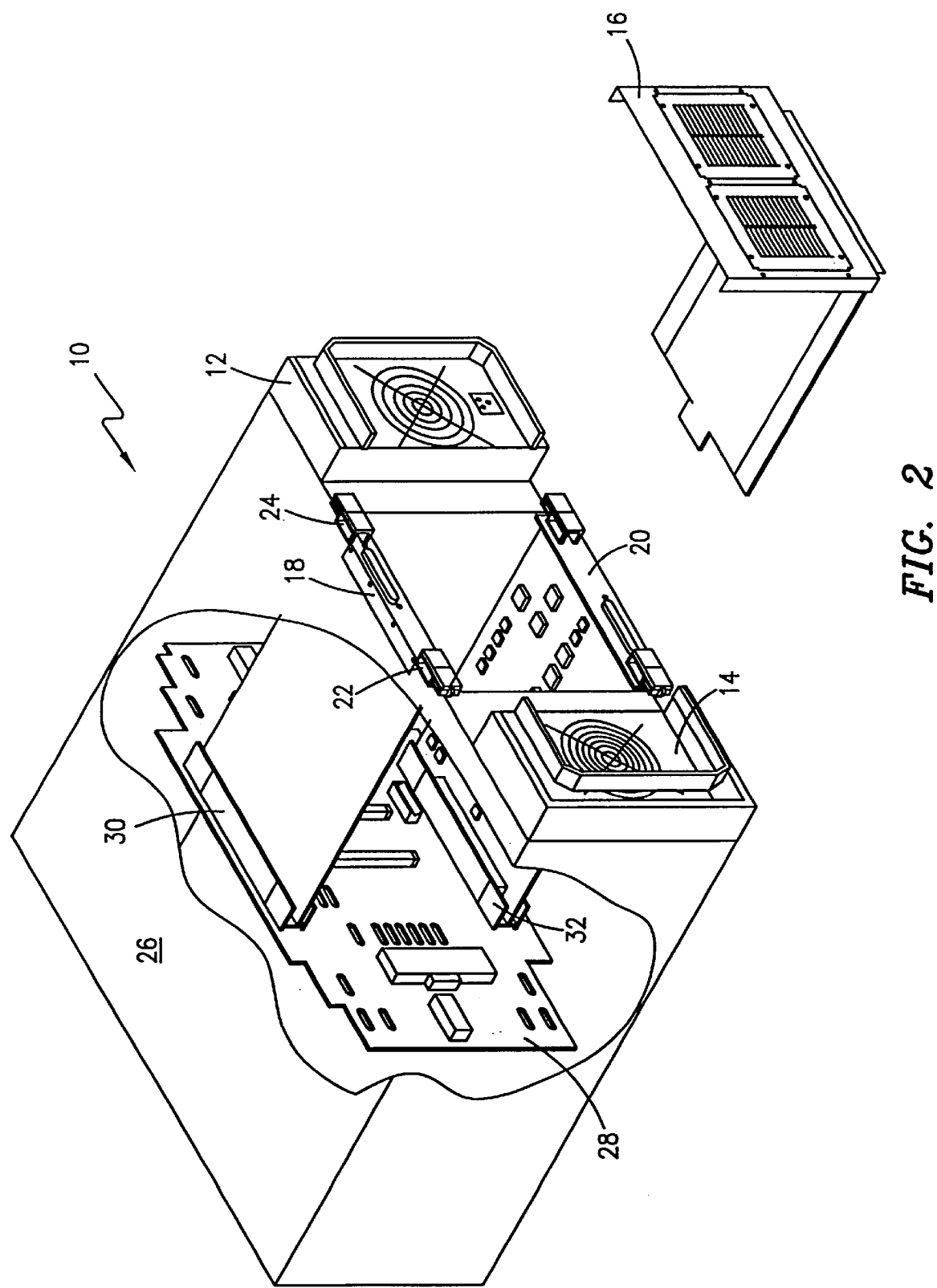
FIG. 2 is partially rear perspective view of the computer system as similarly shown in FIG. 1 with portions broken away illustrating a backplane utilizing the present invention.

Referring now to FIG. 2, there is illustrated a perspective view of computer system 10 with the cooling system 16 removed therefrom and with a portion of the housing 26 broken away. As depicted, redundant SCSI controllers 18 and 20 interface with the computer system 10 by being inserted into a back-plane or SCSI controller interface 28. FIG. 2 further illustrates the 180° opposite orientation relationship between SCSI controller cards 18 and 20.

Figure 3:
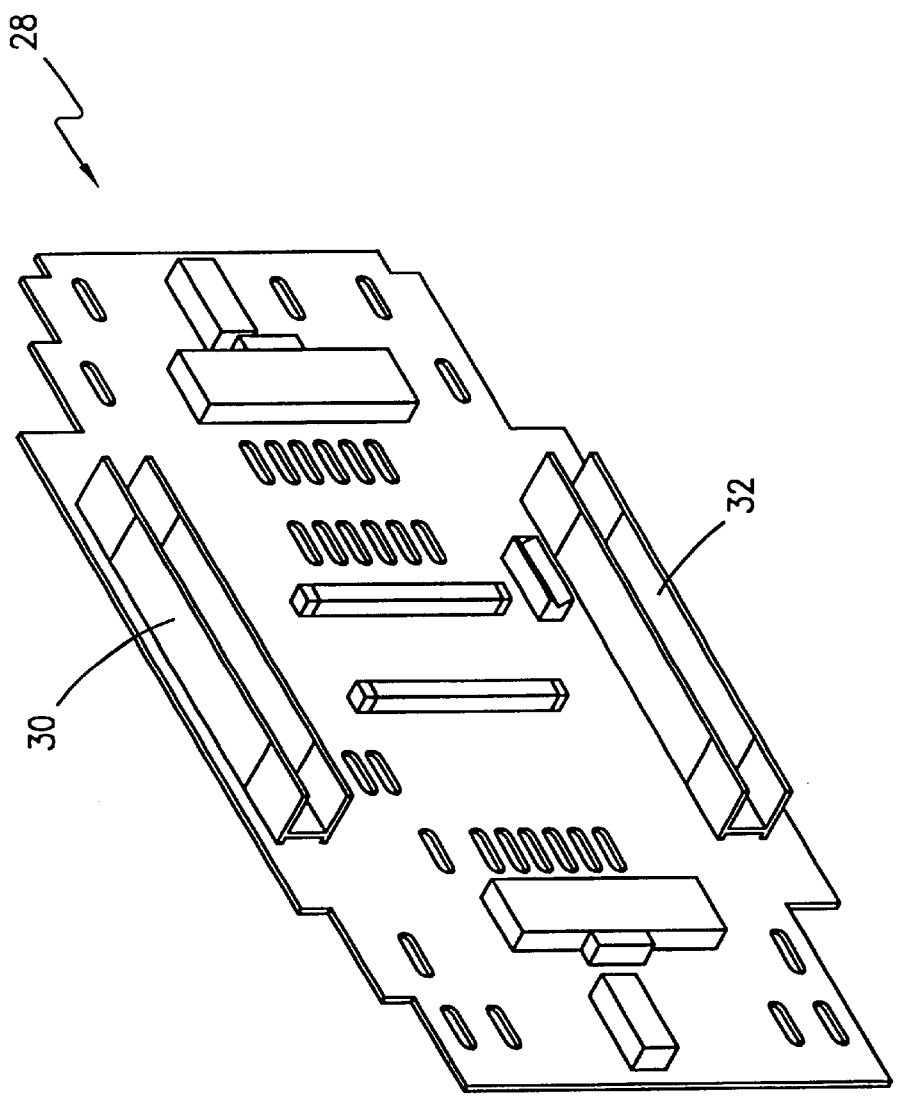
FIG. 3 is an enlarged perspective view of the backplane as similarly shown in FIG. 2.

Referring now to FIG. 3, there is illustrated a perspective view of SCSI controller interface 28. As depicted, SCSI controller interface 28 includes two SCSI slot connectors 30 and 32 for receipt of SCSI controller cards 18 and 20 therein.

Figure 4:
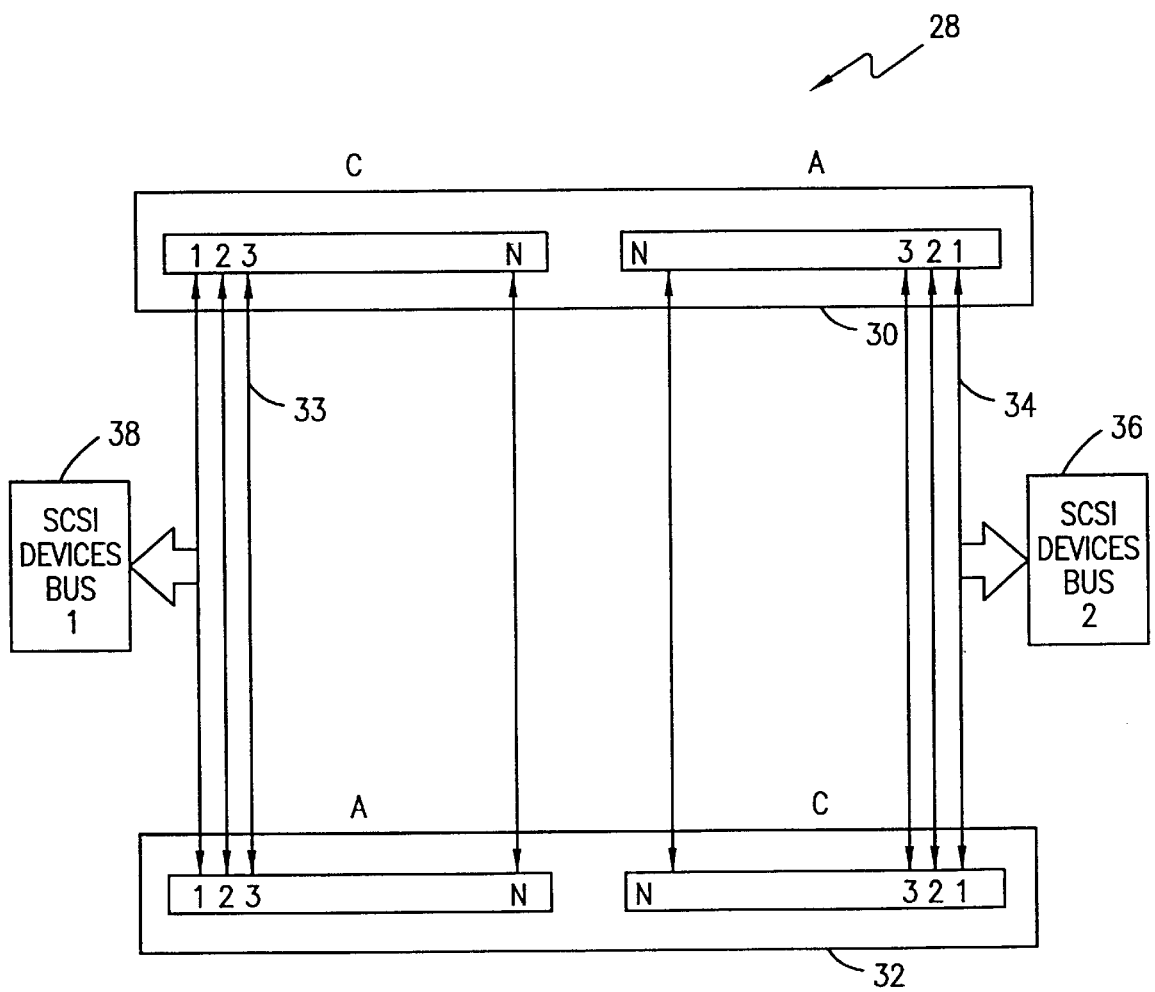
FIG. 4 is a schematic block diagram illustrating an exemplary embodiment of the present invention.

Referring now to FIG. 4, there is illustrated a schematic block diagram of SCSI controller interface 28 in accordance with the principles of the present invention. As depicted, SCSI controller interface 28 includes SCSI slot connectors 30 and 32, each including two slot portions 'A' and 'C'. Each slot portion includes multiple connectors 1-N. The connectors of slot portion 'C' of SCSI slot connector 30 and the connectors of slot portion 'A' of SCSI slot connector 32 are connected to SCSI devices bus 38 through data paths 33. The connectors of slot portion 'A' of SCSI slot connector 30 and the connectors of slot portion 'C' of SCSI slot connector 32 are connected to SCSI devices bus 36 through data paths 34. As depicted, the arrangement of the connectors in slot portion 'A' is mirrored with respect to the arrangement of the connectors in slot portion 'C'. Further, the arrangement of slot portions 'A' and 'C' in SCSI slot connector 30 are reversed from the arrangement of slot portions 'A' and 'C' in SCSI slot connector 32. The arrangement of the connectors within the slots and well as the orientation of the slot portions permits the interchangability of SCSI controller cards 18 and 20 between SCSI slot connectors 30 and 32 without having to cross the data bus paths 33 and 34 from the SCSI slot connectors 30 and 32 to SCSI devices busses 36 and 38 (as depicted in FIG. 4) By not having to cross the data bus paths, the design of the SCSI controller card is kept simple, facilitating easy repair and lowering production costs by not having to provide for the isolation of the crossing data paths.

Although SCSI slot connectors 30 and 32 are depicted with two slot portions 'A' and 'C' having mirrored arranged connectors (1-N), it is contemplated that other arrangements of the connectors and multiple slot portions could be utilized so that the data bus paths 34 from the SCSI slot connectors to the SCSI controller circuitry do not cross.

Those skilled in the art can realize that the teachings of the present invention as described hereinabove provide a SCSI controller interface for receiving multiple interchangeable SCSI controller cards. The SCSI controller interfaces are configured so that the data paths between the SCSI controller slots and the controller circuitry do not cross.

Although a preferred embodiment of the present invention has been illustrated in the accompanying Drawings and described in the foregoing Detailed Description, it will be understood that the invention is not limited to the embodiment disclosed, but is capable of numerous rearrangements, modifications and substitutions without departing from the spirit of the invention as set forth and defined by the following claims.

What is claimed is:

1. A computer system having an interface for receiving multiple, interchangeable peripheral components, said interface comprising:
    backplane;
    a first interface connector attached to said backplane, said first interface connector for connecting to a first interchangeable peripheral component, said first interface connector including a plurality of contacts for transferring data between said first interface connector and the first interchangeable peripheral component, said plurality of contacts of said first interface connector arranged in a first configuration; and
    a second interface connector attached to said backplane, said second interface connector for connecting to a second interchangeable peripheral component, said second interface connector including a plurality of contacts for transferring data between said second interface connector and the second interchangeable peripheral component, said plurality of contacts of said second interface connector arranged in a second configuration, said second configuration being a cross-symmetrical configuration of said first configuration.

2. The interface, as recited in claim 1, further comprising a first controller card connected to said first interface and a second controller card connected to said second interface, said first controller card for controlling the transfer of data between said first interface and the first interchangeable peripheral component and said second controller card for controlling the transfer of data between said second interface and the second interchangeable peripheral.

3. The interface, as recited in claim 2, further comprising a first plurality of data paths, said first plurality of data paths connecting said first controller card and said first interface connector.

4. The interface, as recited in claim 3, further comprising a second plurality of data paths, said second plurality of data paths connecting said second controller card and said second interface connector, said second plurality of data paths positioned in a non-crossing configuration relative to the first plurality of data paths.

5. An interface for associating interchangeable redundant controllers to supported computer hardware, said interface comprising:
    a first slot for receiving a first controller card therein, said first slot including a plurality of contacts for transferring data between said first slot and the first controller card;
    a second slot for receiving a second controller card therein, said second slot including a plurality of contacts for transferring data between said second slot and the second controller card;
    a controller interface connected to said first slot, said second slot and one or more computer components, said controller interface for controlling the transfer of data between the one or more computer components, said first slot and said second slot;
    a first plurality of data paths connecting said controller interface with said first slot; and
    a second plurality of data paths connecting said controller interface with said second slot, each of said second plurality of data paths positioned in a non-crossing configuration relative to the first plurality of data connectors.

6. The interface, as recited in claim 5, wherein said first slot includes a first portion and a second portion, each of said first and second portions including a plurality of contacts, said plurality of contacts in said first portion being configured in a first configuration, and said plurality of contacts in said second portion being configured in a second configuration.

7. The interface, as recited in claim 6, wherein said first configuration is a reverse configuration of said second configuration.

8. The interface, as recited in claim 6, wherein said second slot includes a first portion and a second portion, each of said first and second portions of said second slot including a plurality of contacts, said plurality of contacts in said first portion being configured in a third configuration, and said plurality of contacts in said second portion of said second slot being configured in a fourth configuration.

9. The interface, as recited in claim 8, wherein said third configuration is a reverse configuration of said fourth configuration.

10. The interface, as recited in claim 8, wherein said second configuration is a reverse configuration of said configuration, and further wherein said first configuration is a reverse configuration of said fourth configuration.

11. A small computer systems interface (SCSI) backplane for interfacing interchangeable redundant controllers to supported computer hardware, said interface comprising:
    a first slot for receiving a first controller card therein, said first slot including a plurality of contacts for transferring data between said first slot and the first controller card;
    a second slot for receiving a second controller card therein, said second slot including a plurality of contacts for transferring data between said second slot and the second controller card;
    a controller interface connected to said first slot, said second slot and one or more computer components, said controller interface for controlling the transfer of data between the one or more computer components, said first slot and said second slot;
    a first plurality of data paths connecting said controller interface with said first slot; and
    a second plurality of data paths connecting said controller interface with said second slot, each of said second plurality of data paths positioned in a non-crossing configuration relative to the first plurality of data paths.

* * * * *